US006741413B2

(12) United States Patent
Ohlson

(10) Patent No.: US 6,741,413 B2
(45) Date of Patent: May 25, 2004

(54) COMMON MODE TRANSIENT REDUCTION CIRCUIT FOR IMPROVING TRANSIENT RESPONSE OF AN OPERATIONAL TRANSCONDUCTANCE AMPLIFIER

(75) Inventor: Kevin B. Ohlson, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 09/683,344

(22) Filed: Dec. 17, 2001

(65) Prior Publication Data

US 2003/0112543 A1 Jun. 19, 2003

(51) Int. Cl.[7] ................................................. G11B 5/03
(52) U.S. Cl. ............................. 360/66; 360/25; 360/46; 360/67
(58) Field of Search ............................. 360/25, 46, 67; 327/25, 292, 552

(56) References Cited

U.S. PATENT DOCUMENTS

| 4,004,293 | A | * | 1/1977 | Osburn | 360/67 |
|---|---|---|---|---|---|
| 5,103,188 | A | * | 4/1992 | Bender | 330/265 |
| 5,768,320 | A | * | 6/1998 | Kovacs et al. | 360/46 |
| 6,034,833 | A | * | 3/2000 | Jung | 360/67 |
| 6,184,748 | B1 | * | 2/2001 | Rao et al. | 327/552 |
| 6,380,787 | B1 | * | 4/2002 | Forbes | 327/292 |
| 6,414,806 | B1 | * | 7/2002 | Gowda et al. | 360/25 |

OTHER PUBLICATIONS

P.J. Crawley and G. W. Roberts, Designing Operational Transconductance Amplifiers for Low Voltage Operation, Department of Electrical Engineering, pp. 1–4, McGill University, Montreal, PQ, Canada H3A 2A7.

R.L. Geiger and E. Sanchez–Sinencio, Active Filter Design Using Operational Transconductance Amplifiers: A Tutorial, IEEE Circuits and Devices Magazine, vol. 1, pp. 20–32, Mar. 1985.

* cited by examiner

Primary Examiner—David Hudspeth
Assistant Examiner—Rocio Colon
(74) Attorney, Agent, or Firm—Richard A. Henkler; Bracewell & Patterson, L.L.P.

(57) ABSTRACT

A common mode transient reduction circuit for use with an operational transconductance amplifier having a main amplifier and a common mode feedback amplifier coupled to a common bias voltage is disclosed. The common mode transient reduction circuit includes a delay circuit, coupled between the common bias voltage and the main amplifier, that reduces a magnitude of the main amplifier's common mode voltage output transient when the common bias voltage is changed. In an advantageous embodiment, the delay circuit includes a resistance and a capacitance.

17 Claims, 4 Drawing Sheets

COMMON MODE TRANSIENT REDUCTION CIRCUIT FOR IMPROVING TRANSIENT RESPONSE OF AN OPERATIONAL TRANSCONDUCTANCE AMPLIFIER

BACKGROUND OF THE INVENTION

1. Technical Field

The present invention relates in general to analog signal filters and, in particular, to continuous-time filter circuits utilizing operational transconductance amplifiers. More particularly, the present invention relates to a common mode transient reduction circuit for improving the transient response of an operational transconductance amplifier and a method of operation thereof.

2. Description of the Related Art

A conventional disk drive typically includes one or more magnetic disk platters mounted for rotation on a hub or spindle. A typical disk drive also includes a transducer head supported by a hydrodynamic air bearing that hovers above each magnetic disc. A drive controller is conventionally utilized for controlling the disk drive based on commands received from a host system. The drive controller controls the disk drive to retrieve information from the magnetic disks and to store information on the magnetic disks.

An electromechanical actuator operates within a negative feedback, closed-loop servo system to position the transducer head. The actuator moves the transducer head radially over the disk surface for track seek operations and holds the transducer head directly over a track on the disk surface for track following operations. Information is typically stored in concentric tracks on the surface of the magnetic disks. A number of axially aligned tracks on the disk surfaces are collectively referred to as a cylinder. Data is written to the disk by providing a write signal to one of the transducer heads to encode flux reversals on the surface of the magnetic disk representing the data to be stored. In retrieving data from the disk, the drive controller controls the electromechanical actuator so that the transducer head flies above the magnetic disk, sensing the flux reversals on the magnetic disk and generating a read signal based on those flux reversals. The read signal is typically conditioned and then decoded by the drive controller to recover data represented by flux reversals stored on the magnetic disc and consequently represented in the read signal provided by the transducer head.

A continuous-time filter is generally utilized to reduce wideband noise and for shaping the readback data and is commonly constructed utilizing a number of tunable transconductance stages. Typically, each stage includes an operational transconductance amplifier (OTA). The cutoff frequency of a transconductance ($g_m$C) continuous-time filter is proportional to the product of a transconductance ($g_m$) and the inverse of a load capacitance. For read channel applications, the cutoff frequency of transconductance continuous-time filter must be programmable over at least a 3-to-1 range in two separate modes of operation; a servo mode and a read mode. The two modes of operation require that the cutoff frequency range of the filter to be at least a 5-to-1 ratio. A conventional read channel, for example, may have an overall cutoff frequency range of 20 MHz to 200 MHz. In actual operation, a fast transition in a read channel's transconductance continuous-time filter bandwidth between a low frequency, i.e., servo, operation and a high frequency, i.e., read, operation is desirable. However, when the operational transconductance amplifiers biasing voltage is changed to increase the closed loop bandwidth of the transconductance continuous-time filter, the common mode voltage of the operational transconductance amplifiers is also perturbed. Thus, an unnecessary delay is introduced to allow the common mode level to recover from the bias shift limiting a fast transition from the servo operation to the read operation.

Accordingly, what is needed in the art is an improved transconductance continuous-time filter circuit that mitigates the limitations discussed above. More particularly, what is needed in the art is an operational transconductance amplifier with improved transient response.

BRIEF SUMMARY OF THE INVENTION

To address the above described deficiencies of the prior art, and in accordance with the invention as embodied and broadly described herein, a common mode transient reduction circuit for use with an operational transconductance amplifier having a main amplifier and a common mode feedback amplifier coupled to a common bias voltage is disclosed. The common mode transient reduction circuit includes a delay circuit, coupled between the common bias voltage and the main amplifier, that reduces a magnitude of the main amplifier's common mode voltage output transient when the common bias voltage is changed. In an advantageous embodiment, the delay circuit includes a resistance and a capacitance. In a related embodiment, the delay circuit also decreases the bias time response of the main amplifier to substantially equalize both of the bias time responses of the main and common mode feedback amplifiers when the common bias voltage is changed.

The present invention discloses a novel transient reduction circuit and method for improving the transition response period of a transconductance continuous-time filter utilizing operational transconductance amplifiers when the transconductance continuous-time filter is switched, for example, from a low frequency, i.e., servo, operation to a high frequency, i.e., read, operation. The present invention recognizes that the bias of a common mode feedback amplifier employed in a conventional operational transconductance amplifier changes before that of the operational transconductance amplifier's main amplifier when a common bias voltage is changed, for example, when increasing the closed loop bandwidth of the continuous-time filter. With conventional filters, the transition response period for the operational transconductance amplifier's common mode level to recover from the bias shift limits a fast transition from a servo to a read operation. The present invention utilizes the delay circuit to equalize the response of the operational transconductance amplifier's main and the common mode feedback amplifiers when the common bias voltage is changed. Furthermore, the delay circuit of the present invention also reduces the magnitude of the operational transconductance amplifier's common mode voltage output transient and, consequently, the transition response period required before the signal output from the transconductance continuous-time filter can be effectively utilized is reduced.

In another aspect of the present invention, a method for decreasing a transition period of a continuous-time filter from a low frequency operation to a high frequency operation, where the transconductance continuous-time filter includes at least one operational transconductance amplifier having a main amplifier and a common mode feedback amplifier is disclosed. The method includes utilizing a common bias voltage to bias the main and common mode feedback amplifiers. The method also includes introducing a delay between the common bias voltage and the main amplifier such that the magnitude of the main amplifier's common mode voltage output transient is reduced when the common bias voltage is changed thereby decreasing the transition, or settling, period of the common mode output voltage signal.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE SEVERAL VIEWS OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
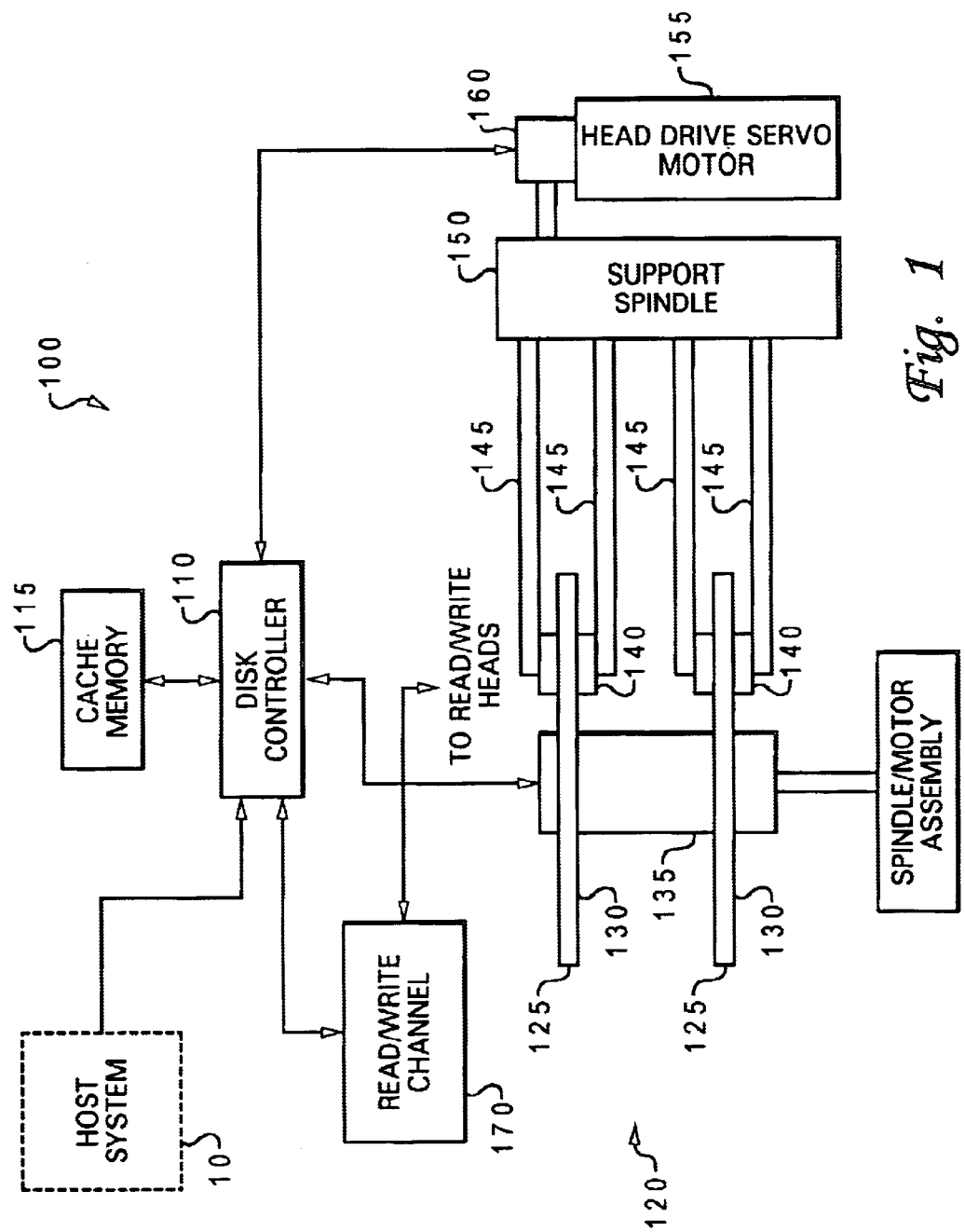
FIG. 1 illustrates an exemplary digital data storage system that provides a suitable environment for the practice of the present invention.

With reference now to the figures and in particular with reference to FIG. 1, there is depicted, in a simplified and diagrammatic form, an exemplary digital data storage system 100 that provides a suitable environment for the practice of the present invention. Data storage system 100, in an advantageous embodiment, is a hard disk drive and includes a controller 110 coupled to a cache memory 115. It should be noted that although the present invention will be described in the context of a data storage system, the present invention does not contemplate limiting its practice to any one particular data storage system. Data storage system 100 also includes a stack 120 of disks, generally designated 125, each of which having at least one magnetic surface 130. Disks 125 are generally mounted parallel to one another for simultaneous rotation on and by an integrated spindle and motor assembly 135. Information on each magnetic disk surface 130 is read from or written to disk surface 130 by a corresponding transducer head assembly 140 movable in a path having a radial component across rotating disk surface 130.

Each transducer head 140 is mounted on a flexure spring (not shown) carried by an arm 145. Arms 145 are typically ganged together for simultaneous pivotal movement about a support spindle 150. One arm 145 includes an extension driven in pivotal movement by a head drive servo motor 155 that includes a voice coil 160 cooperating with an internal magnet and core assembly. Drive signals applied to voice coil 160 cause arms 145 to move in unison to position transducer heads 140 in registration with information storage tracks on disk surfaces 130 where information is written or read.

Data storage system 100 is controlled in operation by signals provided by controller 110, including motor control and head positioning signals. In a typical arrangement, controller 110 provides an interface with a host system 10, such as a conventional computer, that, in an advantageous embodiment, provides data read and write commands. Servo position information is recorded on disk surface 130 and transducer heads 140 read this servo information to provide a servo position signal to controller 110. This information is utilized by controller 110 to provide position control signals. The purpose of this position feedback system is to assure accurate and continuous positioning of transducer heads 140 so that data is written to or read from precise locations on disk surfaces 130.

Data storage system 100 also includes a read/write channel 170 coupled to disk controller 110 that converts the conventional serial data flow to and from disk controller 110 to a reading/writing data operation utilizing transducer head assemblies 140. The construction and operation of read/write channel 170 will be described hereinafter in greater detail with respect to FIG. 2.

Figure 2:
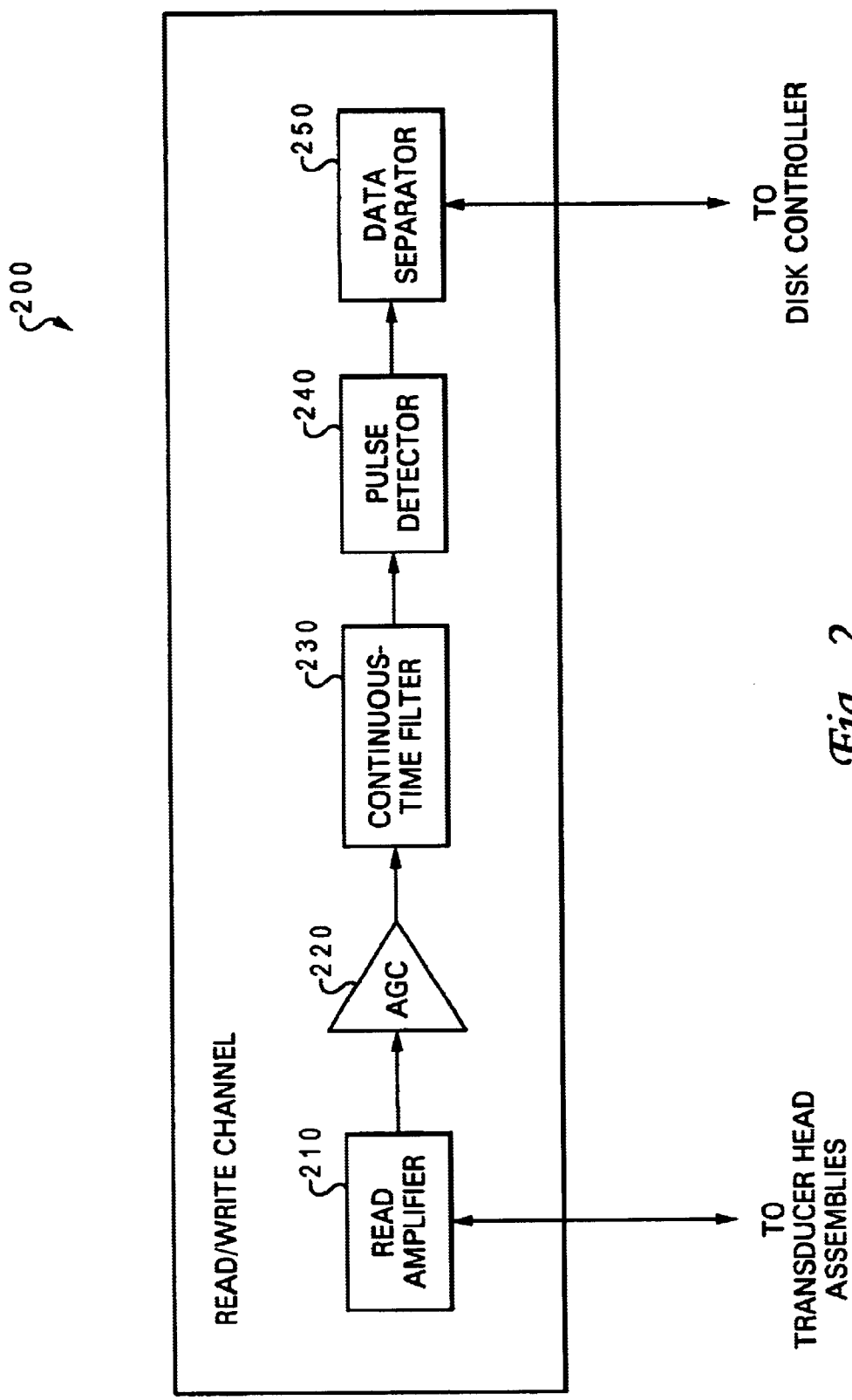
FIG. 2 illustrates a simplified block diagram of an embodiment of a read/write channel utilizing a continuous-time filter according to the principles disclosed by the present invention.

Referring now to FIG. 2, there is illustrated a simplified block diagram of an embodiment of a read/write channel 200 utilizing a transconductance continuous-time filter 230 according to the principles disclosed by the present invention. For ease of explanation of the present invention, the operation of read/write 200 will be described in the context of a read operation. A signal from a transducer head assembly of a hard disk drive is provided to a read amplifier 210 that amplifies the signal prior to its delivery to an automatic gain control (AGC) circuit 220. The output of the automatic gain control circuit 220 is coupled to a filter equalizer circuit that includes transconductance continuous-time filter 230 whose output is, in turn, coupled to a pulse detector 240. The output of the pulse detector is coupled to a data separator 250 that provides the extracted information and a clock signal to a disk controller (not shown).

The signal, which is usually in the microvolt range, is first sensed by a magnetic read head and amplified by the fixed gain of read amplifier 210. Subsequently, the amplitude of the data pulses is then further adjusted by an automatic gain control loop that adjusts the signal level, e.g., between 1 and 2 Vp-p measured differentially. This automatic gain control loop generally includes AGC 220, transconductance continuous-time filter 230 and pulse detector 240. The function of continuous-time filter 230 is to limit the amount of high-frequency noise by providing a well-controlled lowpass characteristic. This increases the signal-to-noise ratio and improves the error-rate performance of the overall system. The equalizer compensates for the uncontrolled lowpass characteristic of read channel 200, which causes intersymbol interference by providing a programmable and well-controlled high-frequency boost. This amplitude boost realizes a second-order approximation to a cosine-equalizer response with linear phase. The equalization allows an increased bit density on the disk, in turn allowing a higher storage capacity since pulses that are more closely spaced can be detected reliably. This cosine equalizer is also referred to as a slimmer circuit because it literally slims the pulses in the time domain.

Pulse detector 240 issues a pulse of fixed duration at the time of the data transitions (signal peaks) by performing a zero-crossing operation on the differentiated output of transconductance continuous-time filter 230. This pulse train is then sent to data separator 250 and decoder block (not shown), which then outputs the data and the clock signal to the disk controller. Typically, most systems encode the data bits with an RLL (1,7 ⅔) (run-length limited) code. This means that for a data rate of 36 Mbps, reliable detection requires, for example, a linear-phase channel filter with a corner frequency of about 20 MHz.

Figure 3:
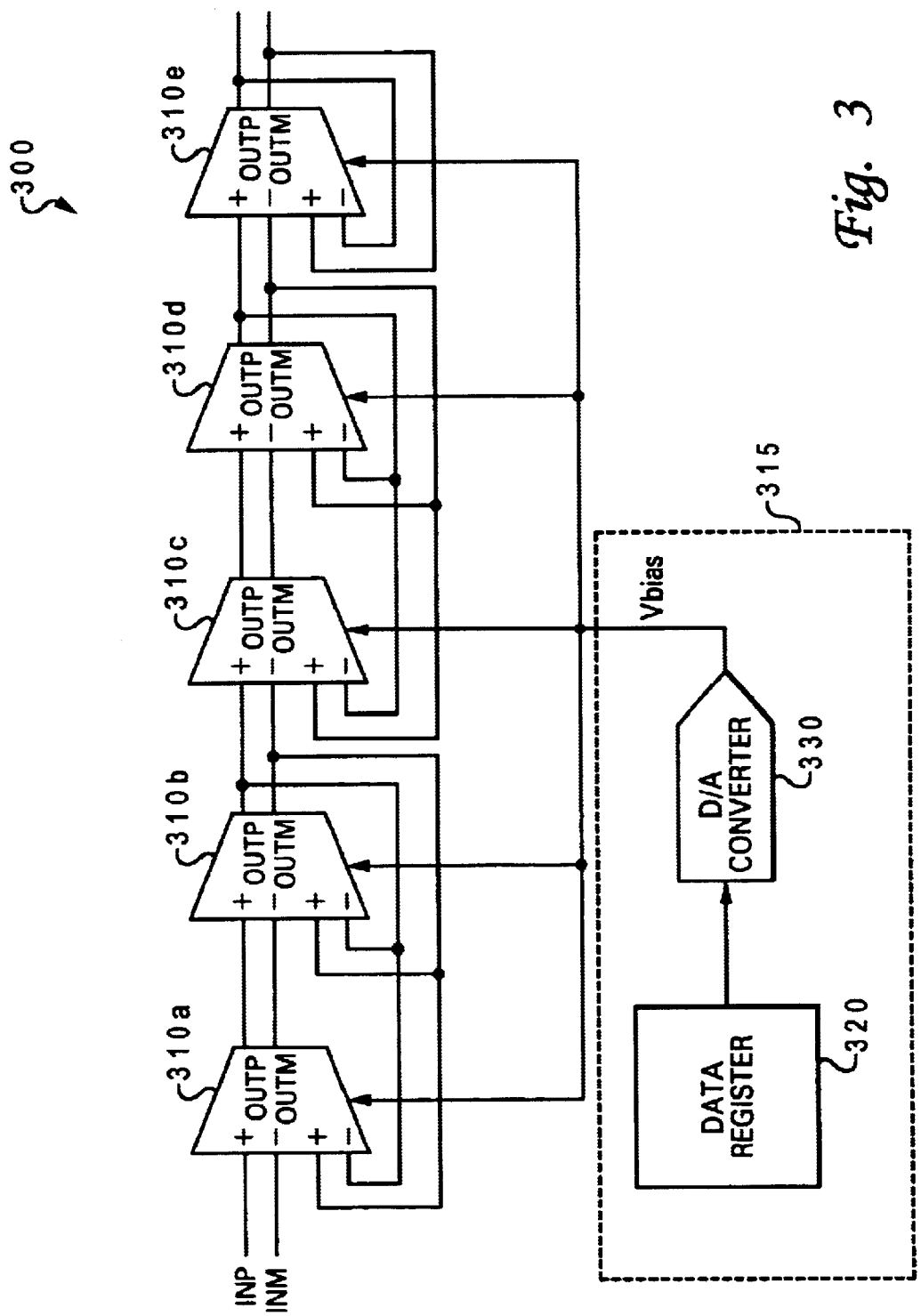
FIG. 3 illustrates a simplified high-level block diagram of an embodiment of a continuous-time filter according to the principles of the present invention.

Referring now to FIG. 3, there is depicted a simplified high-level block diagram of an embodiment of a transconductance continuous-time filter 300 according to the principles of the present invention. Continuous-time filter 300 includes a plurality of operational transconductance amplifiers, generally designated 310a–310e, and a biasing circuit 315. The operational transconductance amplifier is the basic building block of a continuous-time filter, such as continuous-time filter 300. The illustrated embodiment depicts a conventional configuration for a five-pole filter. A pair of operational transconductance amplifiers, e.g., first and second operational amplifiers 310a, 310b, are connected in a feedback configuration to form a transfer function that, in the laplace domain, has a second order polynomial in the denominator. This specific configuration is called a biquad because two operational transconductance amplifiers are connected together to form a quadratic transfer function. To form a multiple pole filter, biquads are cascaded as shown in the illustrated embodiment with each biquad forming two complex poles of continuous-time filter 300. Single pole elements are formed by configuring a single operational transconductance amplifier, such as fifth operational transconductance amplifiers 310e, as depicted in the last stage of continuous-time filter 300.

By designing each of the plurality of operational transconductance amplifiers 310a–310e with uniquely sized field effect transistor (FET) input stages, the transconductance of each input is defined. Therefore, with the proper feedback configurations, the desired transfer function of continuous-time filter 300 is obtained. With respect to the cutoff frequency of continuous-time filter 300, programming the cutoff frequency is achieved by controlling a biasing voltage Vbias supplied to the plurality of operational transconductance amplifiers 310a–310e by biasing circuit 315 that includes a data register 320 and a digital to analog converter 330. As shown in the illustrated embodiment, data register 320 is utilized by the read channel employing continuous-time filter 300. Data register 320 is programmed with a digital value representing the desired biasing voltage level. The required biasing voltage Vbias is then generated by converting the digital word stored in data register 320 utilizing digital to analog converter 330.

Figure 4:
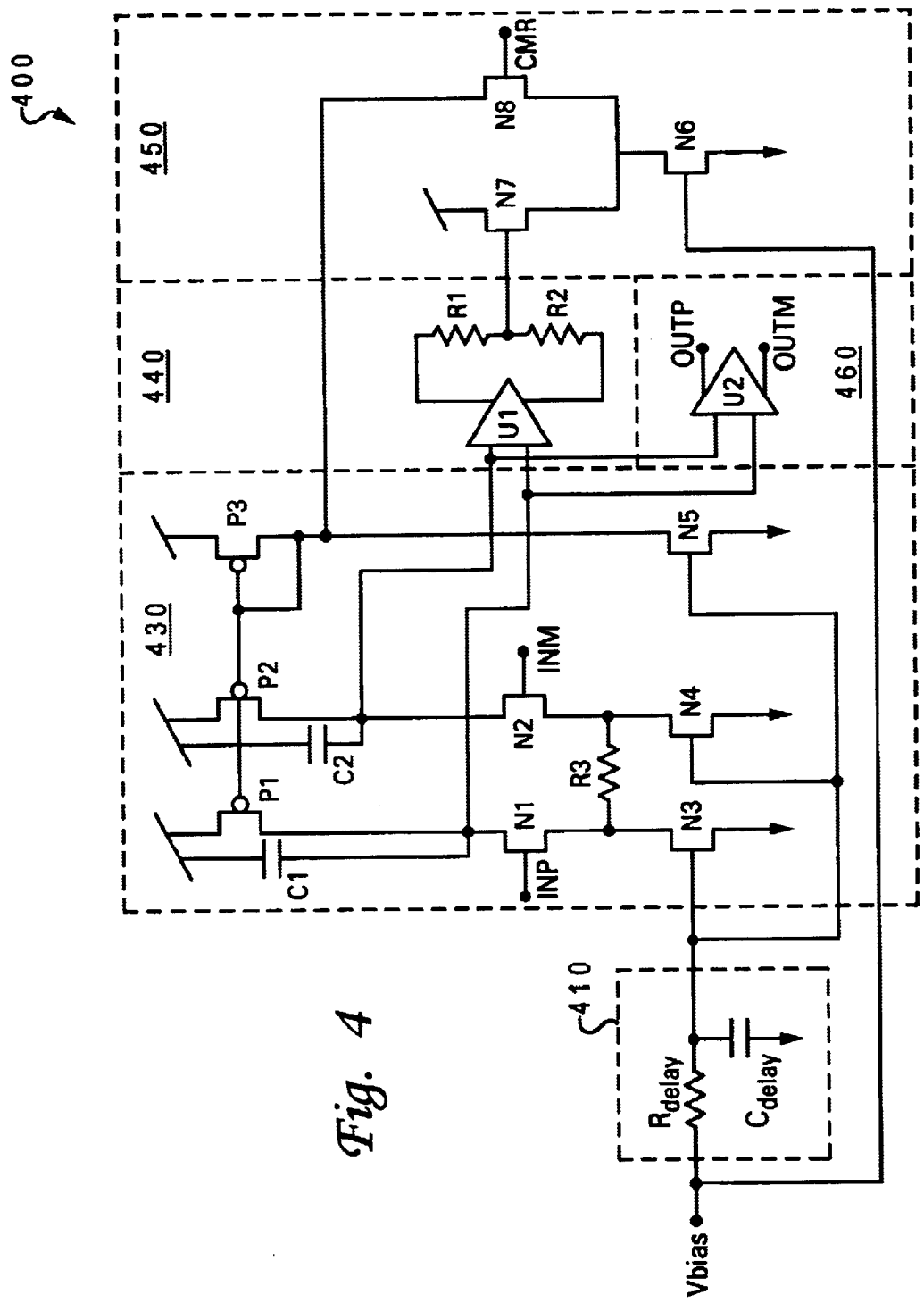
FIG. 4 illustrates a schematic diagram of an of an operational transconductance amplifier utilizing an embodiment of a common mode transient reduction circuit constructed according to the principles disclosed by the present invention.

Referring now to FIG. 4, there is illustrated a schematic diagram of an operational transconductance amplifier 400 utilizing an embodiment of a common mode transient reduction circuit 410 constructed according to the principles disclosed by the present invention. Operational transconductance amplifier 400 includes a main amplifier 430 coupled to a common mode feedback (CMFB) amplifier 450 via a first buffer circuit 440 that, in an advantageous embodiment, is an operational amplifier U1 configured as a buffer circuit. A second buffer circuit 460, in an advantageous embodiment, is utilized in operational transconductance amplifier 400 to provide common mode signals externally to other operational transconductance amplifiers. Alternatively, in other advantageous embodiments, the externally provided common mode signals may also be buffered by first buffer circuit 440. Operational transconductance amplifier 400 also includes a common mode transient reduction circuit 410 coupled to main amplifier 430 and a biasing voltage Vbias input terminal that provides biasing voltages to both main amplifier 420 and CMFB amplifier 450. As shown in the illustrated embodiment, common mode transient reduction circuit 410 includes a delay circuit having a resistance Rdelay and a capacitance Cdelay.

Typically, utilizing conventional design practices, first, second and third p-channel field effect transistors (PFETs) P1, P2, P3 and third, fourth, fifth and sixth n-channel field effect transistors (NFETs) N3, N4, N5, N6 utilized in operational transconductance amplifier 400 are selected such that, under nominal conditions, the currents through first and second PFETs P1, P2 are equal in value with the currents through first and second NFETs N1, N2. This can be accomplished by setting the channel width/channel length (W/L) ratios of first, second and third PFETs P1, P2, P3 and third, fourth, fifth and sixth NFETs N3, N4, N5, N6. However, due to normal variations present in integrated circuits, the currents in first and second PFETs P1, P2 and first and second NFETs N1, N2 are never matched. This mismatch of currents results in the common mode voltage at the drains of first and second PFETs P1, P2 being uncontrollable. The common mode voltage may be too high or, alternatively, too low depending on the direction of the mismatch in first and second PFETs P1, P2 and first and second NFETs N1, N2 currents. CMFB amplifier 450 is utilized to adjust the currents through first and second PFETs P1, P2 to equal the currents through first and second NFETs N1, N2, thus maintaining the common mode voltage to a desired value (CMR). Typically, about 20% of the current through third PFET P3 is sourced by CMFB amplifier 450 with the remaining 80% passing through fifth NFET N5.

As described previously, a filter cutoff frequency change is programmed in a read channel's storage registers (analogous to data register 320 depicted in FIG. 3) that is utilized to control, e.g., a current digital to analog converter (DAC), that, in turn, controls the value of Vbias. Vbias's voltage level sets the tail current in the differential input devices in operational transconductance amplifier 400. Since the transconductance (gm) of operational transconductance amplifier 400 is proportional to the tail current and the cutoff frequency is proportional to the product of the transconductance (gm) and the inverse of the load capacitance, i.e., first and second capacitors C1, C2, the cutoff frequency of a filter utilizing operational transconductance amplifier 400 is programmable by varying the value of Vbias. Increasing the value of Vbias results in a higher cutoff frequency.

To illustrate, assume that the cutoff frequency of a filter circuit is being switched from a lower to a higher frequency, i.e., a lower Vbias to a higher Vbias value. In an operational transconductance amplifier that does not utilize common mode transient reduction circuit 410, the tail currents of main amplifier 430 and CMFB amplifier 450 increases together. The currents through fifth and sixth NFETs N5, N6 increases the current through third PFET P3 and, consequently, the currents through first and second PFETs P1, P2. With first and second NFETs N1, N2 pulling more current before the currents in first and second PFETs P1, P2 are sourced, a common mode disturbance is created with the first and second NFETs N1, N2 pulling the common mode voltage down. CMFB amplifier 450 senses the common mode change at the gate of seventh NFET N7 and the differential action of CMFB amplifier 450 routes more of the current available in sixth NFET N6 through eight NFET N8 to third PFET P3. The resulting current through third PFET P3 is, in turn, mirrored into first and second PFETs P1, P2.

The utilization of common mode transient reduction circuit 410 in operational transconductance amplifier 400 delays the increase in main amplifier's 430 tail current and allows the current through CMFB amplifier 450 to increase the current in third PFET P3 and, consequently, increasing the currents through first and second PFETs P1, P2 prior to, or simultaneous with, the increase in currents through third and fourth NFETs N3, N4 and first and second NFETs N1, N2. The delay introduced with common mode transient reduction circuit 410 is set to match the delay in the current reference, i.e., third PFET P3, and current mirrors, i.e., first and second PFETs P1, P2, thus minimizing the common mode disturbance in operational transconductance amplifier 400.

While the invention has been particularly shown and described with reference to a preferred embodiment, it will be understood by those skilled in the art that various changes in form and detail may be made therein without departing from the spirit and scope of the invention.

What is claimed is:

1. A common mode transient reduction circuit for use with a operational transconductance amplifier having a main amplifier and a common mode feedback amplifier coupled to a common bias voltage, comprising:
    a delay circuit, coupled between said common bias voltage and said main amplifier, that reduces a magnitude of said main amplifier's common mode voltage output transient when said common bias voltage is changed, wherein said delay circuit decreases a bias time response of said main amplifier to substantially equalize the bias time responses of said main and common mode feedback amplifiers when said common bias voltage is changed.

2. The common mode transient reduction circuit as recited in claim 1, wherein said delay circuit includes a resistance and a capacitance.

3. A common mode transient reduction circuit for use with a operational transconductance amplifier having a main amplifier and a common mode feedback amplifier coupled to a common bias voltage, comprising:
    a delay circuit, coupled between said common bias voltage and said main amplifier, that reduces a magnitude of said main amplifier's common mode voltage output transient when said common bias voltage is changed, wherein said operational transconductance amplifier further includes a buffer coupled between said main amplifier and said common mode feedback amplifier.

4. The common mode transient reduction circuit as recited in claim 3, wherein said buffer includes an operational amplifier.

5. A method for decreasing a transition period of a transconductance continuous-time filter from a low frequency operation to a high frequency operation, wherein said transconductance continuous-time filter includes at least one operational transconductance amplifier having a main amplifier and a common mode feedback amplifier, comprising:
    utilizing a common bias voltage to bias said main and common mode feedback amplifiers; and
    introducing a delay between said common bias voltage and said main amplifier that reduces a magnitude of said main amplifier's common mode voltage output transient when said common bias voltage is changed thereby decreasing said transition period, wherein said introducing a delay between said common bias voltage and said main amplifier includes decreasing a bias time response of said main amplifier to substantially equalize the bias time responses of said main and common mode feedback amplifiers when said common bias voltage is changed.

6. The method as recited in claim 5, wherein said introducing a delay includes utilizing a delay circuit having a resistance and a capacitance.

7. The method as recited in claim 5, further comprises changing said common bias voltage to increase a closed loop bandwidth of said transconductance continuous-time filter.

8. A transconductance continuous-time filter, comprising:
    a biasing circuit that provides a common bias voltage; and
    at least one operational transconductance amplifier coupled to said biasing circuit, said operational transconductance amplifier including:
        a main amplifier;
        a common mode feedback amplifier; and
        a delay circuit, coupled between said main amplifier and said biasing circuit, that reduces a magnitude of said main amplifier's common mode voltage output transient when said common bias voltage is changed, wherein said delay circuit decreases a bias time response of said main amplifier to substantially equalize the bias time responses of said main and common mode feedback amplifiers when said common bias voltage is changed.

9. The transconductance continuous-time filter as recited in claim 8, wherein said delay circuit includes a resistance and a capacitance.

10. The transconductance continuous-time filter as recited in claim 8, wherein said biasing circuit includes a data register and a digital to analog converter.

11. A transconductance continuous-time filter, comprising:
    a biasing circuit that provides a common bias voltage; and
    at least one operational transconductance amplifier coupled to said biasing circuit, said operational transconductance amplifier including:
        a main amplifier;
        a common mode feedback amplifier; and
        a delay circuit, coupled between said main amplifier and said biasing circuit, that reduces a magnitude of said main amplifier's common mode voltage output transient when said common bias voltage is changed, wherein said operational transconductance amplifier further includes a buffer coupled between said main amplifier and said common mode feedback amplifier.

12. The transconductance continuous-time filter as recited in claim 8, wherein said common bias voltage is changed to increase a closed loop bandwidth of said transconductance continuous-time filter.

13. A data storage system, comprising:
    a controller;
    a recording medium having a plurality of disk platters, wherein each of said plurality of disk platters having at least one magnetic surface;
    a plurality of transducer head assemblies, wherein each of said plurality of transducer head assemblies is associated with a corresponding magnetic surface of said plurality of disks; and a read/write channel, coupled to said plurality of transducer head assemblies, wherein said read/write channel includes a transconductance continuous-time filter circuit, said transconductance continuous-time filter circuit including:

a biasing circuit that provides a common bias voltage; and at least one operational transconductance amplifier coupled to said biasing circuit, said operational transconductance amplifier comprising:

a main amplifier;

a common mode feedback amplifier; and a delay circuit, coupled between said main amplifier and said biasing circuit, that reduces a magnitude of said main amplifier's common mode voltage output transient when said common bias voltage is changed, wherein said delay circuit decreases a bias time response of said main amplifier to substantially equalize the bias time responses of said main and common mode feedback amplifiers when said common bias voltage is changed.

14. The data storage system as a recited in claim 13, wherein said read/write channel further includes:

a read amplifier;

an automatic gain controller; and a pulse detector.

15. The data storage system as recited in claim 13, wherein said delay circuit includes a resistance and a capacitance.

16. The data storage system as recited in claim 13, wherein said biasing circuit includes a data register and a digital to analog converter.

17. The data storage system as recited in claim 13, wherein said data storage system is a hard disk drive.

* * * * *